United States Patent
Chwa et al.

(10) Patent No.: US 6,399,443 B1
(45) Date of Patent: Jun. 4, 2002

(54) METHOD FOR MANUFACTURING DUAL VOLTAGE FLASH INTEGRATED CIRCUIT

(75) Inventors: Siow Lee Chwa; Yung Tao Lin, both of Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 09/850,906

(22) Filed: May 7, 2001

(51) Int. Cl.$^7$ ........................................... H01L 21/8247
(52) U.S. Cl. ........................ 438/258; 438/275; 438/591; 438/981
(58) Field of Search ............................... 438/201, 211, 438/258, 261, 275, 591, 981

(56) References Cited

U.S. PATENT DOCUMENTS

| | | | |
|---|---|---|---|
| 5,723,355 A | * 3/1998 | Chang et al. | 438/258 |
| 5,888,869 A | * 3/1999 | Cho et al. | 438/258 |
| 6,184,093 B1 | * 2/2001 | Sung | 438/981 |
| 6,331,492 B2 | * 12/2001 | Misium et al. | 438/275 |

* cited by examiner

*Primary Examiner*—Chandra Chaudhari
(74) *Attorney, Agent, or Firm*—Mikio Ishimaru (57) ABSTRACT

A method is provided for manufacturing a multiple voltage flash memory integrated circuit structure on a semiconductor substrate having a plurality of shallow trench isolations and a floating gate structure. A first dielectric layer is formed and a portion removed to expose regions of the semiconductor substrate for first and second low voltage devices. A second dielectric layer is formed over the first dielectric layer and the semiconductor substrate and a portion removed to expose a region of the semiconductor substrate for the second low voltage device. A third dielectric layer is formed over the second dielectric layer to form: a floating gatedevice including the first, second, and third dielectric layers; a first voltage device including the first, second, and third dielectric layers; a second voltage device including the second and third dielectric layers; and a third voltage device including the third dielectric layer.

25 Claims, 6 Drawing Sheets

METHOD FOR MANUFACTURING DUAL VOLTAGE FLASH INTEGRATED CIRCUIT

TECHNICAL FIELD

The present invention relates generally to the manufacturing of dual voltage flash integrated circuits and more particularly to a method in which the mask steps may be reduced and conventional processing used.

BACKGROUND ART

Flash electrically-eraseable programmable and read-only memories (flash EEPROMs) are a class of non-volatile memory devices that are programmed by hot electron injection and erased by Fowler-Nordheim tunneling. Flash EEPROMs are read/programmed byte-by-byte or word-by-word, and are erased globally (full chip erase) or partially by a particular portion of the overall array (sector erase). These integrated circuits generally require dual voltages for operation and have peripheral semiconductor devices along with the flash memory cell which use these dual voltages.

Each memory cell is formed on a semiconductor substrate (i.e., a silicon die or chip) having a heavily doped drain region and a source region embedded in the semiconductor substrate. The source region further contains a lightly doped deeply diffused region and a more heavily doped shallow diffused region embedded in the substrate. A channel region separates the drain region and the source region. The memory cell further includes a multilayer structure, commonly referred to as a "stacked gate" structure by which the charge indicative of the state of the flash EEPROM is controlled.

In the past, in manufacturing a dual voltage flash EEPROM, after active and floating gate polysilicon areas are formed, alternating layers of oxide-nitride-oxide (ONO) dielectric material was thermally grown on the polysilicon and the silicon substrate. A photoresist mask (mask) was then introduced to selectively allow removal of the top oxide and nitride layers of the ONO, followed by an oxide stripping etch to remove the bottom oxide of the ONO at the peripheral region of the integrated circuit.

An oxide (for high voltage devices) was thermally grown (a gate oxidation I) after removal of the mask.

Subsequently, a number of masks had to be used for the low voltage (LV) well, field, channel, and voltage threshold ($V_t$) implant. A first is used for the LV N-well implant, a second for an LV P-field (Pfld) implant, a third mask for an LV thin gate (first voltage) P-channel $V_t$ implant, a fourth mask for an LV thick-gate (second voltage) P-channel $V_t$implant, a fifth mask for an LV thin-gate (first voltage) N-channel $V_t$ implant, and a sixth mask for an LV thick-gate (second voltage) N-channel $V_t$ implant.

A further mask is then introduced for the LV thick gate oxidation creation, and oxide strip is implemented to remove the gate oxidation I at the LV region. A gate oxide then was thermally grown (a gate oxidation II) after removal of the mask. Finally, another mask was used for the LV thin gate oxide creation and a further oxide strip.

Finally, a further polysilicon is deposited and the remaining conventional steps of the manufacturing process for the flash EEPROM are performed.

The above steps are problematic because of the number of masks required and incompatability with individual processes used by different foundries. A solution which would allow for a simplified more universal process has long been sought, but has equally long eluded those skilled in the art.

DISCLOSURE OF THE INVENTION

The present invention provides A method is provided for manufacturing a multiple voltage flash memory integrated circuit structure on a semiconductor substrate having a plurality of shallow trench isolations and a floating gate structure. A first dielectric layer is formed and a portion removed to expose regions of the semiconductor substrate for first and second low voltage devices. A second dielectric layer is formed over the first dielectric layer and the semiconductor substrate and a portion removed to expose a region of the semiconductor substrate for the second low voltage device. A third dielectric layer is formed over the second dielectric layer to form: a floating gate including the first, second, and third dielectric layers; a first voltage device including the first, second, and third dielectric layers; a second voltage device including the second and third dielectric layers; and a third voltage device including the third dielectric layer. This method is simplified over the prior art and uses individual processes which are conventional and well-known to those skilled in the art.

The above and additional advantages of the present invention will become apparent to those skilled in the art from a reading of the following detailed description when taken in conjunction with the accompanying drawings.

BEST MODE FOR CARRYING OUT THE INVENTION

Referring now to FIGS. 1A through 1D, therein are shown various cross-sections of a flash EEPROM integrated circuit at an intermediate stage of manufacture.

Figure 1A:
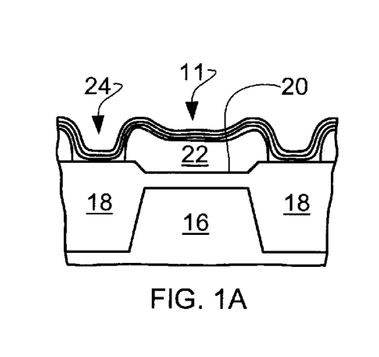
FIGS. 1A through 1D shows various cross-sections of a wafer in an intermediate stage of manufacturing after deposition of alternating dielectric layers.

FIG. 1A shows a memory region, which upon completion of processing will contain a plurality of memory cells 11. The plurality of memory cells 11 will be formed on a semiconductor substrate 16, generally of silicon, into which shallow trench isolations 18, generally of an oxide, have been formed. The implantations for forming the channels, wells, and/or junctions of the plurality of memory cells 11 will have been completed. A gate dielectric layer, generally an oxide layer 20, has been formed over the semiconductor substrate 16 and the shallow trench isolations 18. The oxide layer 20 generally becomes a part of the oxide material of the shallow trench isolations 18. As shown, polysilicon has been deposited over the oxide layer 20 and patterned to form a plurality of polysilicon floating gates 22 and alternating layers of dielectric material, an ONO layer 24, have been deposited over the plurality of polysilicon floating gates 22 and the shallow trench isolations 18. The ONO layer 24 consists of alternating layers of oxide, nitride and oxide.

Figure 1B:
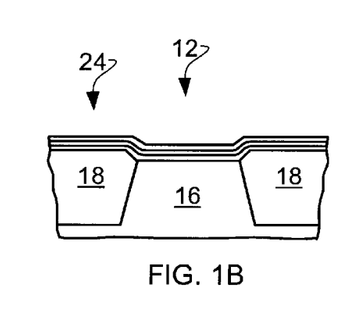

Referring now to FIG. 1B, therein is shown a portion of a peripheral region, which upon completion of processing will contain a plurality of high voltage devices 12. The implantations for forming the channels, wells, and/or junctions of the plurality of high voltage devices 12 will have been completed. In FIG. 1B and the remaining FIGS., those elements which are the same as in previous FIGS. are designated by the same numbers. Thus, FIG. 1B shows the shallow trench isolations 18 and the semiconductor substrate 16 covered by the ONO layer 24.

Figure 1C:
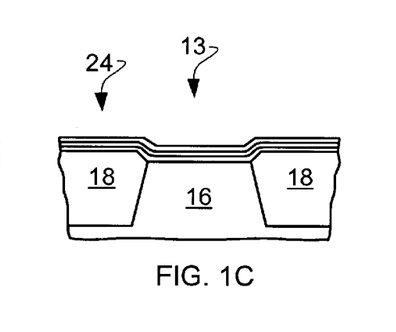

Referring now to FIG. 1C, therein is shown a peripheral region, which upon completion of processing will contain a plurality of first low voltage devices 13. At this stage of manufacture, the structure is the same as FIG. 1B.

Figure 1D:
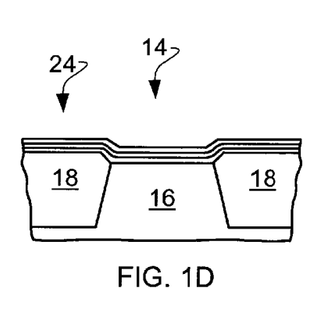

Referring now to FIG. 1D, therein is shown a portion of the peripheral region, which upon completion of processing will contain a plurality of second low voltage devices 14. When completed, the plurality of second low voltage devices 14 will operate at a lower voltage than the plurality of first low voltage devices 13.

The structures of FIGS. 1A through 1D are formed by conventional processes well known to those skilled in the art.

Figure 2A:
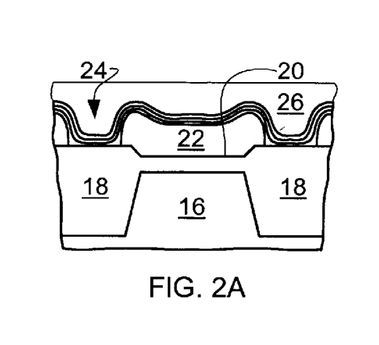
FIGS. 2A through 2D shows various cross-sections of the wafer after the deposition and processing of a photoresist layer and removal of a portion of the alternating dielectric materials.

Referring now to FIG. 2A, therein is shown the structure of FIG. 1A having a photoresist mask or an ONO mask 26 deposited over the ONO layer 24.

Figure 2B:
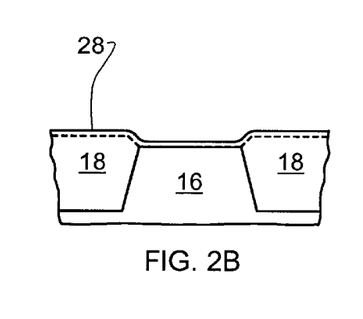

Referring now to FIG. 2B, therein is shown the structure of FIG. 1B after removal of the oxide and nitride layers from the ONO layer 24 to leave a bottom oxide layer 28 which is integral with the shallow trench isolations 18 and the semiconductor substrate 16.

Figure 2C:
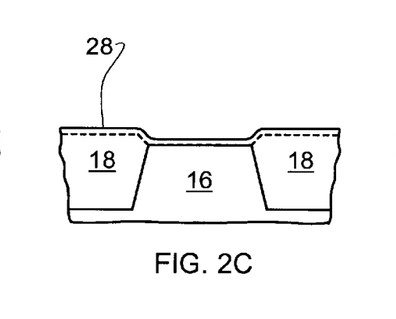

Referring now to FIG. 2C, therein is shown the structure of FIG. 1C after the same removal process of FIG. 2B to show the bottom oxide layer 28 of the ONO layer 24 integral with the shallow trench isolations 18 and the semiconductor substrate 16.

Figure 2D:
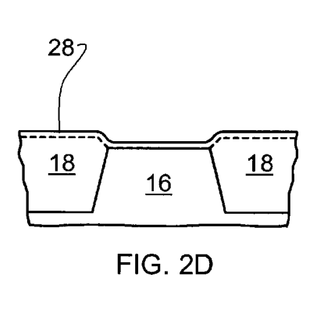

Referring now to FIG. 2D, therein is shown the structure of FIG. 1D after the same removal process of FIG. 2B to show the bottom oxide layer 28 of the ONO layer 24 integral with the shallow trench isolations 18 and the semiconductor substrate 16.

Figure 3A:
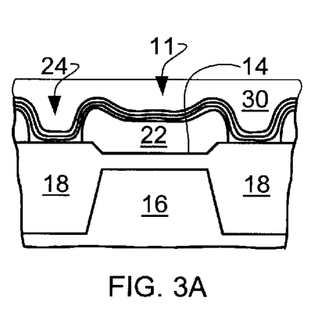
FIGS. 3A through 3D shows various cross-sections of the wafer after deposition and processing of a photoresist layer and implantation.

Referring now to FIG. 3A, therein is shown the structure of FIG. 2A having the ONO mask 26 removed and an N-well mask 30 deposited over the ONO layer 24.

Figure 3B:
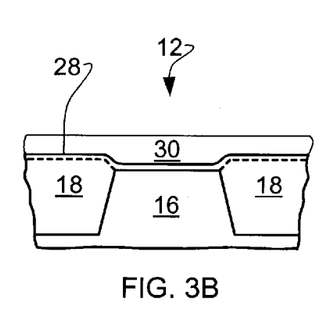

Referring now to FIG. 3B, therein is shown the structure of FIG. 2B having the N-well mask 30 deposited on the bottom oxide layer 28.

Figure 3C:
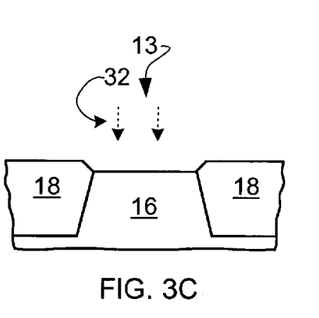

Referring now to FIG. 3C, therein is shown the structure of FIG. 2C having the N-well mask 30 deposited, patterned, and developed to form a mask opening. After an N-well implantation 32 through the bottom oxide layer 28 into the semiconductor substrate 16 an oxide etch has been performed to remove the bottom oxide layer 28 to expose the semiconductor substrate 16.

Figure 3D:
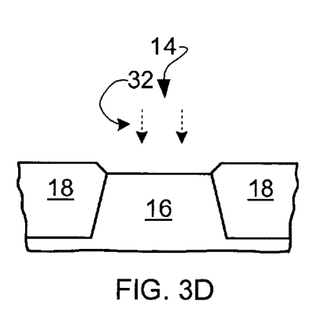

Referring now to FIG. 3D, therein is shown the structure of FIG. 2D having the N-well mask 30 deposited, patterned, and developed to form a mask opening. After the N-well implantation 32 through the bottom oxide layer 28 into the semiconductor substrate 16, an oxide etch has been performed to remove the bottom oxide layer 28 to expose the semiconductor substrate 16.

Figure 4A:
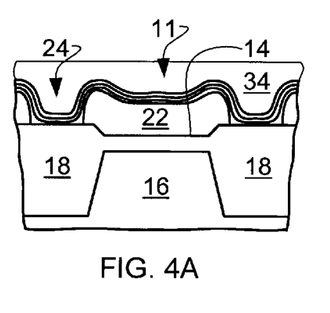
FIGS. 4A through 4D shows various cross-sections of the wafer after deposition and processing of a photoresist layer and implantation.

Referring now to FIG. 4A, therein is shown the structure of FIG. 3A having the N-well mask 30 removed and a P-well mask 34 deposited over the ONO layer 24.

Figure 4B:
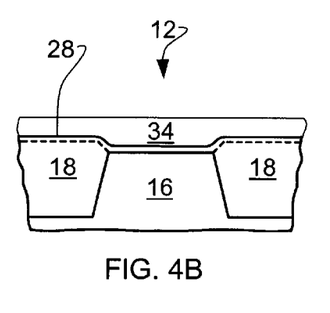

Referring now to FIG. 4B, therein is shown the structure of FIG. 3B having the P-well mask 34 deposited on the bottom oxide layer 28.

Figure 4C:
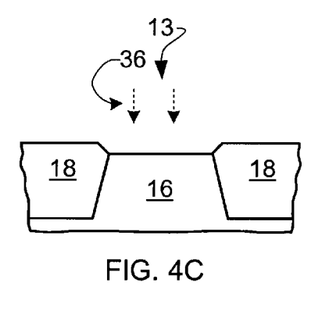

Referring now to FIG. 4C, therein is shown the structure of FIG. 3C having the P-well mask 34 deposited, patterned, and developed to form a mask opening. After a P-well implantation 36 through the bottom oxide layer 28 into the semiconductor substrate 16, an oxide etch has been performed to remove the bottom oxide layer 28 to expose the semiconductor substrate 16.

Figure 4D:
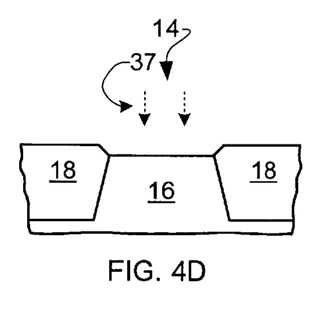

Referring now to FIG. 4D, therein is shown the structure of FIG. 3D having the P-well mask 34 deposited, patterned, and developed to form a mask opening. After an N-well implantation 37 through the bottom oxide layer 28 into the semiconductor substrate 16, an oxide etch has been performed to remove the bottom oxide layer 28 to expose the semiconductor substrate 16.

As would be understood by those skilled in the art, both the first and second low voltage devices 13 and 14 will contain N-wells and P-wells so the above FIGS. 3C through 3D and FIGS. 4C through 4D show representations of implantations through openings in the respective masks 30 and 34 which actually expose dfferent portions of the semiconductor substrate 16 so only one type of well is implanted in each portion. Further, the N-wells and P-wells may be implanted in any order.

Figure 5A:
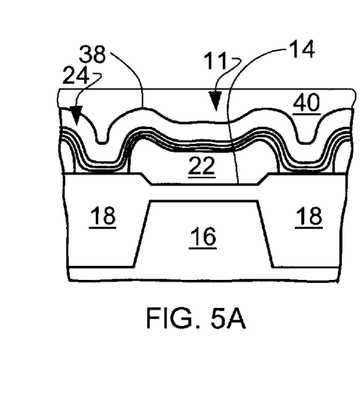
FIGS. 5A through 5D shows various cross-sections of the wafer after deposition of a dielectric layer, deposition and processing of a photoresist layer, and implantation.

Referring now to FIG. 5A, therein is shown the structure of FIG. 4A having a first gate oxide layer 38 deposited over the ONO layer 24 and a first voltage P-channel $V_t$ mask 40 deposited over the first gate oxide layer 38.

Figure 5B:
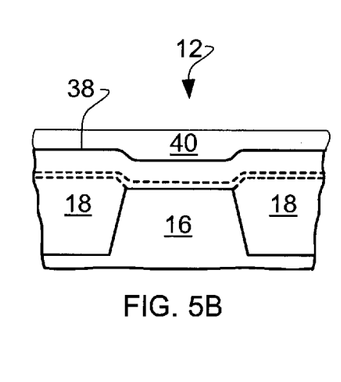

Referring now to FIG. 5B, therein is shown the structure of FIG. 4B having the first gate oxide layer 38 deposited over the bottom oxide layer 28 and the first voltage P-channel $V_t$ mask 40 deposited over the first gate oxide layer 38. The first gate oxide layer 38 in the one mode is grown to a thickness of 80 Å.

Figure 5C:
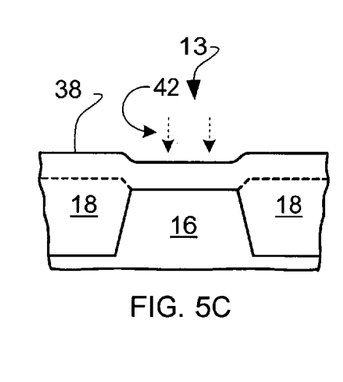

Referring now to FIG. 5C, therein is shown the structure of FIG. 4C having the first voltage P-channel $V_t$ mask 40 deposited, patterned, and developed to form a mask opening. A P-channel implantation 42 for the threshold voltage implantation is perfomed through the openings in the first voltage P-channel $V_t$ mask 40 and through the first gate oxide layer 38 into the semiconductor substrate 16.

Figure 5D:
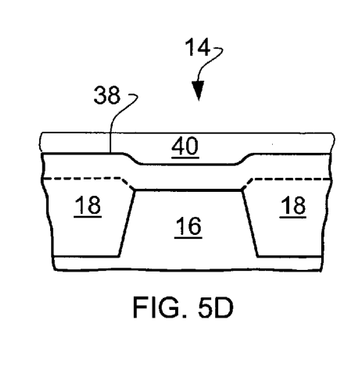

Referring now to FIG. 5D, therein is shown the structure of FIG. 4D having the first gate oxide layer 38 deposited over the bottom oxide layer 28 and the first voltage P-channel $V_t$ mask 40 deposited over the first gate oxide layer 38.

Figure 6A:
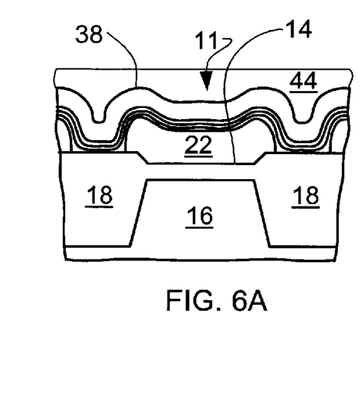
FIGS. 6A through 6D shows various cross-sections of the wafer after deposition and processing of a photoresist layer and implantation.

Referring now to FIG. 6A, therein is shown the structure of FIG. 5A having first voltage N-channel $V_t$ mask 44 deposited over the first gate oxide layer 38.

Figure 6B:
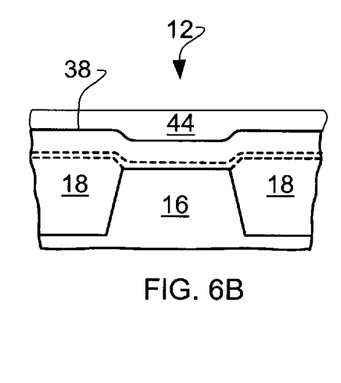

Referring now to FIG. 6B, therein is shown the structure of FIG. 5B having the first voltage N-channel $V_t$ mask 44 deposited over the first gate oxide layer 38.

Figure 6C:
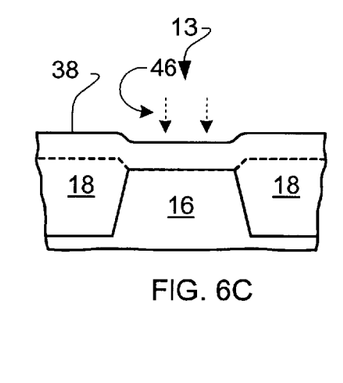

Referring now to FIG. 6C, therein is shown the structure of FIG. 5C having the first voltage N-channel $V_t$ mask 44 deposited, patterned, and developed to form a mask opening. An N-channel $V_t$ implantation 46 for the threshold voltage implantation is perfomed through the openings in the first voltage N-channel $V_t$ mask 44 and through the first gate oxide layer 38 into the semiconductor substrate 16.

Figure 6D:
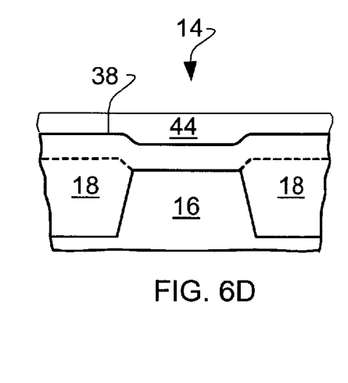

Referring now to FIG. 6D, therein is shown the structure of FIG. 5D having the first voltage N-channel $V_t$ mask 44 deposited over the first gate oxide layer 38.

As would be understood by those skilled in the art, the plurality of first low voltage devices 13 will contain P-channels for the N-wells and and N-channels for the P-wells so the above FIGS. 5C through 5D and FIGS. 6C through 6D show representations of implantations through openings in the respective masks 40 and 44 which actually expose dfferent portions of the semiconductor substrate 16 so only one type of channel of the opposite conductivity is implanted in each portion of the plurality of first low voltage devices 13. Further, the N-channels and P-channels may be implanted in any order.

Figures 7A, 7B:
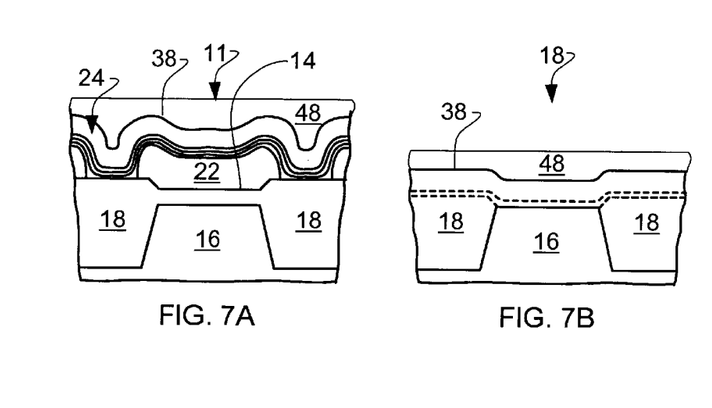
FIGS. 7A through 7D shows various cross-sections of the wafer after deposition and processing of a photoresist layer and implantation.

Referring now to FIG. 7A, therein is shown the structure of FIG. 6A having the first voltage N-channel $V_t$ mask 44 removed and the first gate oxide layer 38 deposited over the ONO layer 24 and a second voltage P-channel $V_t$ mask 48 deposited over the first gate oxide layer 38.

Referring now to FIG. 7B, therein is shown the structure of FIG. 6B having the first voltage N-channel $V_t$ mask 44 removed and the first gate oxide layer 38 deposited over the bottom oxide layer 28 and the second voltage P-channel $V_t$ mask 48 deposited over the first gate oxide layer 38.

Figure 7C:
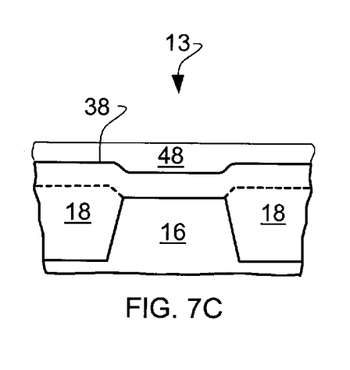

Referring now to FIG. 7C, therein is shown the structure of FIG. 6C having the first voltage N-channel $V_t$ mask 44 removed and the first gate oxide layer 38 and the second voltage P-channel $V_t$ mask 48 deposited over the first gate oxide layer 38.

Figure 7D:
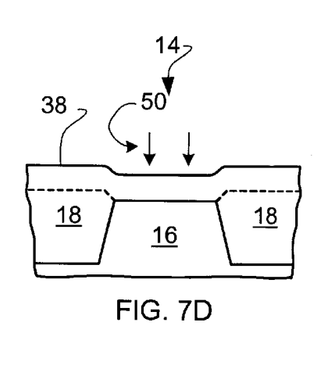

Referring now to FIG. 7D, therein is shown the structure of FIG. 6D having the first voltage N-channel $V_t$ mask 44 removed and the second voltage P-channel $V_t$ mask 48 deposited, patterned, and developed to form a mask opening. A P-channel implantation 50 for the threshold voltage implantation is perfomed through the openings in the second voltage P-channel $V_t$ mask 48 and through the first gate oxide layer 38 into the semiconductor substrate 16.

Figure 8A:
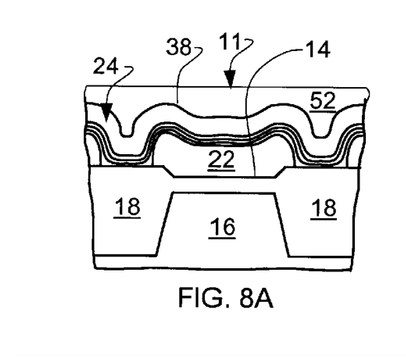
FIGS. 8A through 8D shows various cross-sections of the wafer after deposition and processing of a photoresist layer and implantation.

Referring now to FIG. 8A, therein is shown the structure of FIG. 7A having the second voltage P-channel $V_t$ mask 48 removed and a second voltage N-channel $V_t$ mask 52 deposited over the first gate oxide layer 38.

Figure 8B:
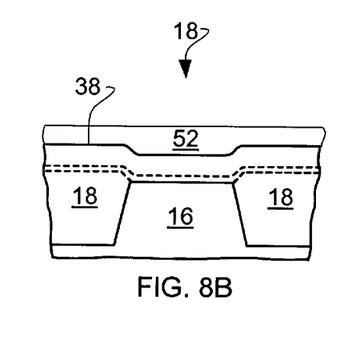

Referring now to FIG. 8B, therein is shown the structure of FIG. 7B having the second voltage P-channel $V_t$ mask 48 removed and the second voltage N-channel $V_t$ mask 52 deposited over the first gate oxide layer 38.

Figure 8C:
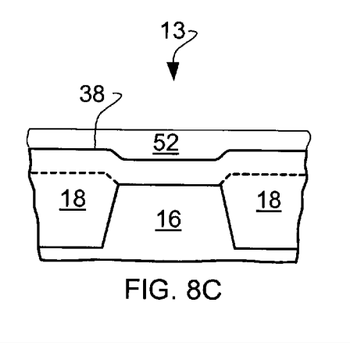

Referring now to FIG. 8C, therein is shown the structure of FIG. 7C having the second voltage P-channel $V_t$ mask 48 removed and the second voltage N-channel $V_t$ mask 52 deposited over the first gate oxide layer 38.

Figure 8D:
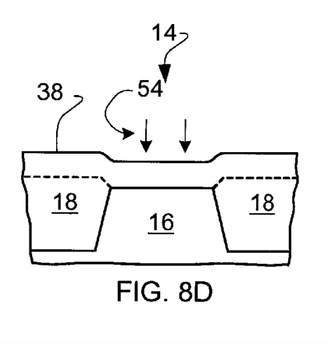

Referring now to FIG. 8D, therein is shown the structure of FIG. 7D having the second voltage N-channel $V_t$ mask 52 deposited, patterned, and developed to form a mask opening.

An N-channel $V_t$ implantation 54 for the threshold voltage implantation is perfomed through the openings in the second voltage N-channel $V_t$ mask 52 and through the first gate oxide layer 38 into the semiconductor substrate 16. Then, an oxide etch is performed to remove the first gate oxide layer 38 to expose the semiconductor substrate 16.

As would be understood by those skilled in the art, the plurality of second low voltage devices 14 will contain P-channels for the N-wells and and N-channels for the P-wells so the above FIGS. 7C through 7D and FIGS. 8C through 8D show representations of implantations through openings in the respective masks 48 and 52 which actually expose dfferent portions of the semiconductor substrate 16 so only one type of channel of the opposite conductivity is implanted in each portion of the plurality of second low voltage devices 14. Further, the N-channels and P-channels may be implanted in any order.

Figure 9A:
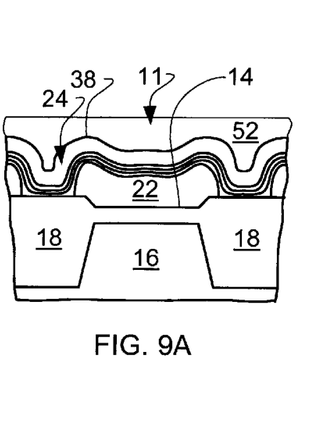
FIGS. 9A through 9D shows various cross-sections of the wafer after deposition and processing of a photoresist layer and removal of a dielectric layer.

Referring now to FIG. 9A, therein is shown the structure of FIG. 8A unchanged because the second voltage N-channel $V_t$ mask 52 protects the structure from a removal operation which has been completed as explamined below.

Figure 9B:
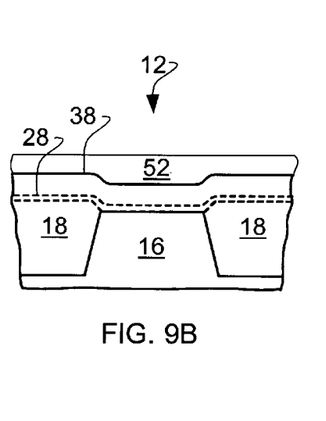

Referring now to FIG. 9B, therein is shown the structure of FIG. 8B unchanged because the second voltage N-channel $V_t$ mask 52 protects the structure from a removal operation which has been completed as explamined below.

Figure 9C:
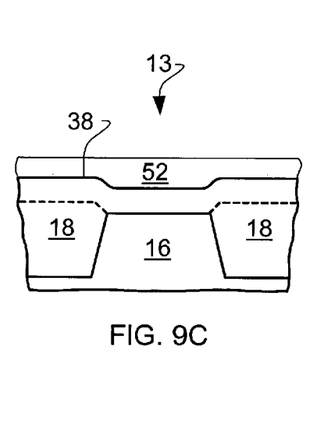

Referring now to FIG. 9C, therein is shown the structure of FIG. 8C unchanged because the second voltage N-channel $V_t$ mask 52 protects the structure from a removal operation which has been completed as explamined below.

Figure 9D:
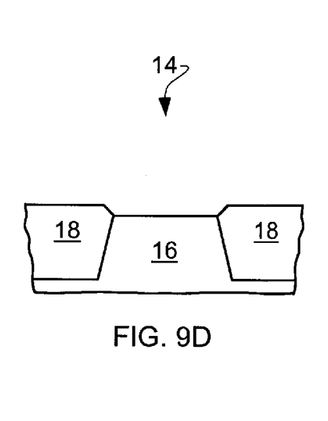

Referring now to FIG. 9D, therein is shown the structure of FIG. 8D having the first gate oxide layer 38 removed by a process, such as etching, to expose the semiconductor substrate 16 and the shallow trench isolations 18.

Figure 10A:
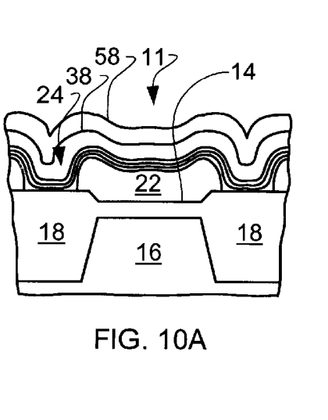
FIGS. 10A through 10D shows various cross-sections of the wafer after deposition and processing of a photoresist layer and deposition of a dielectric layer.

Referring now to FIG. 10A, therein is shown the structure of FIG. 9A after removal of the second voltage N-channel $V_t$ mask 52, and a gate oxidation II, which thermally grows a second gate oxide layer 58 on the first gate oxide layer 38.

Figure 10B:
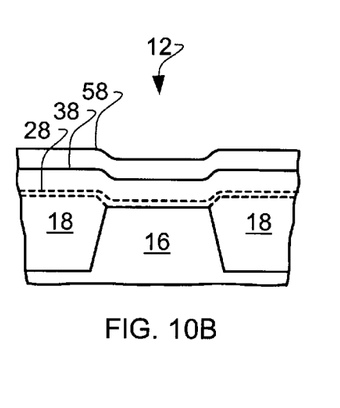

Referring now to FIG. 10B, therein is shown the structure of FIG. 9B after removal of the second voltage N-channel $V_t$ mask 52 and the gate oxidation II which deposits the second gate oxide layer 58 as shown in FIG. 10A.

Figure 10C:
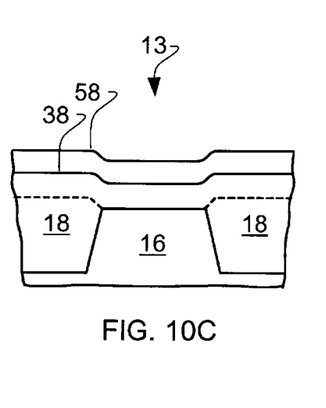

Referring now to FIG. 10C, therein is shown the structure of FIG. 9C after removal of the second voltage N-channel $V_t$ mask 52 and the gate oxidation II which deposits the second gate oxide layer 58 as shown in FIG. 10A.

Figure 10D:
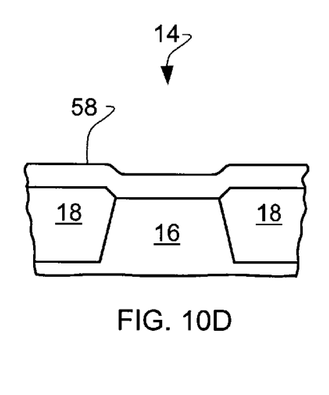

Referring now to FIG. 10D, therein is shown the structure of FIG. 9D after the gate oxidation II, which deposits the second gate oxide layer 58 on the shallow trench isolations 18 and the semiconductor substrate 16.

After removal of the second voltage N-channel $V_t$ mask 52, a chemical (i.e. RCA-like cleaning solution) cleaning process of 100:1 hydrogen fluoride dip is implemented prior to thermally growing an oxide, a gate oxidation III.

Figure 11A:
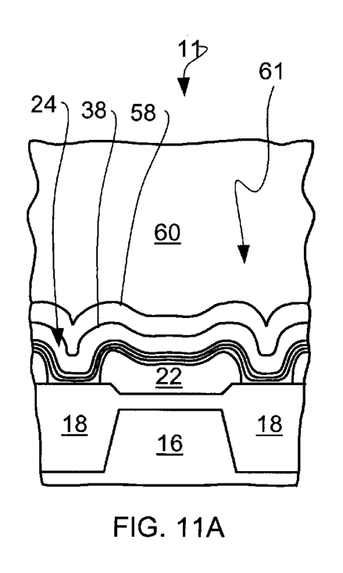
FIGS. 11A through 11D shows various cross-sections of the wafer after deposition of a semiconductor material.

Referring now to FIG. 11A, therein is shown the structure of FIG. 10A having a semiconductor layer such as a polysilicon layer 60 deposited over a gate oxide 61 which consists of the ONO layer 24, the first gate oxide layer 38, and the second gate oxide layer 58 to form the plurality of memory cells 11.

Figure 11B:
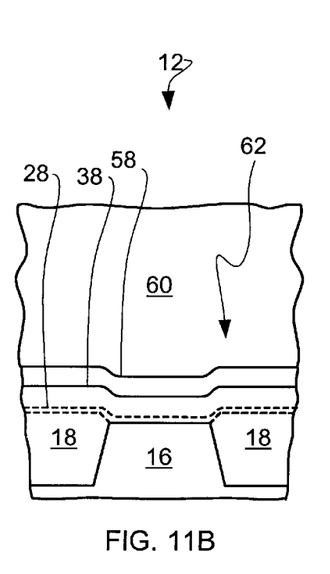

Referring now to FIG. 11B, therein is shown the structure of FIG. 10B having the polysilicon layer 60 deposited over a gate oxide 62 which consist of the bottom oxide layer 28 of the ONO layer 24, the first gate oxide layer 38, and the second gate oxide layer 58 to form the plurality of high voltage devices 12.

Figure 11C:
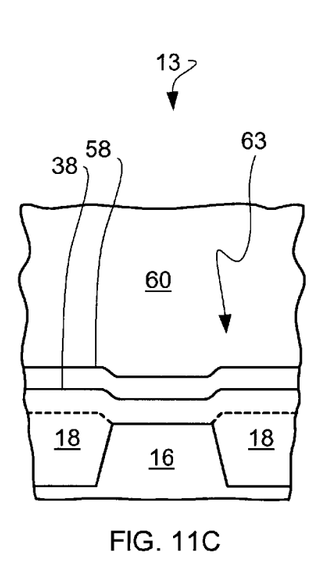

Referring now to FIG. 11C, therein is shown the structure of FIG. 10C having the polysilicon layer 60 deposited over a gate oxide 63 which consists of the first gate oxide layer 38 and the second gate oxide layer 58 to form the plurality of first low voltage devices 13.

Figure 11D:
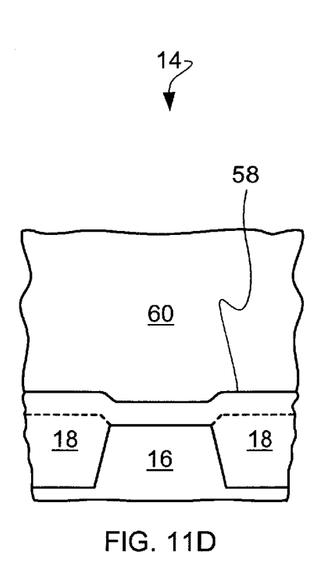

Referring now to FIG. 11D, therein is shown the structure of FIG. 10D having the polysilicon layer 60 deposited over the second gate oxide layer 58 to form the plurality of second low voltage devices 14.

Thus, by reference to FIGS. 11A through 11D, it may be shown that semiconductor devices have been formed having a plurality of gate thicknesses due to the layered structures 58, 61, 62, 63 for different voltages. In particular, the plurality of high voltage devices 12 is for the highest voltage, the plurality of first low voltage devices 13 is next for the next highest voltage, and finally, the plurality of second low voltage devices 14 is appropriate for the lowest voltage.

In the present invention, the manufacturing method to produce the plurality of memory cells 11, the plurality of high voltage devices 12, the plurality of first low voltage devices 13, and the plurality of second low voltage devices 14 is performed as follows:

1. The semiconductor substrate 16 is provided with the shallow trench isolations 18 formed and the implantations for the plurality of memory cells 11 and the plurality of high voltage devices 12 performed. The plurality of polysilicon floating gates 22 is also formed for the plurality of memory cells 11.

2. The alternating dielectric layers of the ONO layer 24 are thermally grown on the plurality of polysilicon floating gates 22 and the shallow trench isolations 18 in a core memory region which includes the plurality of memory cells 11 of FIG. 1A and also on the semiconductor substrate 16 and the shallow trench isolations 18 of a peripheral region shown in FIGS. 1B through 1D. Alternality, the ONO layer can be formed by depositing nitride and oxide films using CVD methods.

3. The ONO mask 26 is deposited over the ONO layer 24 and is patterned and developed to expose the peripheral region for removal of the top oxide and nitride layers of the ONO layer 24 to expose the bottom oxide layer 28 as shown in FIGS. 2B through 2D.

3. The ONO mask 26 is removed.

4. The N-well mask 30 is deposited over the ONO layer 24 and the bottom oxide layer 28 and is patterned and developed to expose the bottom oxide layer 28 over the semiconductor substrate 16 a first selected plurality of the first and second low voltage devices 13 and 14.

5. The N-well implantation 32 is performed using the N-well mask 30 into the first selected plurality of the first and second low voltage devices 13 and 14.

6. An oxide strip is performed to remove the bottom oxide layer 28 from the shallow trench isolations 18 and the semiconductor substrate 16 for the first selected plurality of the first and second low voltage devices 13 and 14 which have the N-wells implanted.

7. The N-well mask 30 is removed.

8. The P-well mask 34 is deposited over the ONO layer 24 and the bottom oxide layer 28 and is patterned and developed to expose the bottom oxide layer 28 over the semiconductor substrate 16 a second selected plurality of the first and second low voltage devices 13 and 14.

9. The P-well implantation 36 is performed using the P-well mask 34 into a second selected plurality of the first and second low voltage devices 13 and 14.

10. An oxide strip is performed to remove the bottom oxide layer 28 from the shallow trench isolations 18 and the semiconductor substrate 16 for the the second selected plurality of the first and second low voltage devices 13 and 14 which have the P-wells implanted.

11. The steps 4 through 7 leave the structure as shown in FIGS. 3A through 3D and the steps 8 through 11 leave the structure as shown in FIGS. 4A through 4D.

12. The P-well mask 34 is removed.

13. The first gate oxide layer 38 is thermally grown over the ONO layer 24 of memory cell 11, the bottom oxide layer 28 of high voltage devices 12, and the semiconductor substrate 16 of low voltage devices 13, 14.

14. The first low voltage P-channel $V_t$ mask 40 is deposited over the first gate oxide layer 38 and is patterned and developed to expose the first gate oxide layer 38 over the N-wells for the plurality of first low voltage devices 13.

15. The P-channel $V_t$ implantation 42 is performed using the first voltage P-channel $V_t$ mask 40 into the the N-wells for the plurality of first low voltage devices 13.

16. The first low voltage P-channel $V_t$ mask 40 is removed.

17. The first low voltage N-channel $V_t$ mask 44 is deposited over the first gate oxide layer 38 and is patterned and developed to expose the first gate oxide layer 38 over the P-wells for the plurality of first low voltage devices 13.

18. The N-channel $V_t$ implantation 46 is performed using the first low voltage N-channel $V_t$ mask 44 into the P-wells for the plurality of first low voltage devices 13.

19. The steps 12 through 15 leave the structure as shown in FIGS. 5A through 5D and the steps 16 through 18 leave the structure as shown in FIGS. 6A through 6D.

20. The first voltage N-channel $V_t$ mask 44 is removed.

21. The second low voltage P-channel $V_t$ mask 48 is deposited over the first gate oxide layer 38 and is patterned and developed to expose the first gate oxide layer 38 over the N-wells for the plurality of second low voltage devices 14.

22. The P-channel $V_t$ implantation 50 is performed using the second low voltage P-channel $V_t$ mask 48 into the the N-wells for the plurality of second low voltage devices 14.

23. An oxide strip is performed to remove the first gate oxide layer 38 from the shallow trench isolations 18 and the semiconductor substrate 16 over the N-wells for the plurality of second low voltage devices 14.

24. The second low voltage P-channel $V_t$ mask 48 is removed.

25. The second low voltage N-channel $V_t$ mask 52 is deposited over the first gate oxide layer 38 and is patterned and developed to expose the first gate oxide layer 38 over the P-wells for the plurality of second low voltage devices 14.

26. The N-channel $V_t$ implantation 54 is performed using the second low voltage P-channel $V_t$ mask 48 into the P-wells for the plurality of second low voltage devices 14.

27. An oxide strip is performed to remove the first gate oxide layer 38 from the shallow trench isolations 18 and the semiconductor substrate 16 over the P-wells for the plurality of second low voltage devices 14.

28. The steps 20 through 22 leave the structure as shown in FIGS. 7A through 7D and the steps 24 through 26 leave the structure as shown in FIGS. 8A through 8D.

29. The steps 23 and 27 leave the structure as shown in FIGS. 9A through 9D.

30. An RCA clean with 30" at 100:1 hydrogen fluoride is implemented to remove about 20 Å of oxide in one embodiment.

31. The second gate oxide layer 58 is deposited over the ONO layer 24, the first gate oxide layer 38, and the semiconductor substrate 16 of the memory cell 11.

32. The polysilicon layer 60 is deposited over the second gate oxide layer 58.

In one embodiment, the first gate oxide layer 38 is deposited to a thickness of 80 Å and is cleaned to a thickness of 65 Å while the second gate oxide layer 58 is deposited to a thickness of 30 Å. The polysilicon layer 60 is deposited to a thickness of around 2,000 Å.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing a multiple voltage flash memory integrated circuit structure comprising:

providing a semiconductor substrate having a plurality of shallow trench isolations and a floating gate structure;

forming a first dielectric layer on the semiconductor substrate, the plurality of shallow trench isolations and the floating gate structure;

removing a portion of the first dielectric layer over the semiconductor substrate;

forming a second dielectric layer over the first dielectric layer and the semiconductor substrate;

removing a portion of the second dielectric layer over the first dielectric layer and the semiconductor substrate;

forming a third dielectric layer over the second dielectric layer and the semiconductor substrate;

forming a semiconductor layer over the third dielectric layer to form:
  a floating gate device including the first, second, and third dielectric layers;
  a first voltage device including the first, second, and third dielectric layers;
  a second voltage device including the second and third dielectric layers; and
  a third voltage device including the third dielectric layer.

2. The method as claimed in claim 1 including:

forming a first mask over the first dielectric layer after forming the first dielectric layer;

processing the first mask to expose the portion of the first dielectric layer over the semiconductor substrate;

removing the portion of the first dielectric layer using the first mask; and removing the first mask.

3. The method as claimed in claim 2 including:

forming a second mask over the second dielectric layer after forming the second dielectric layer;

processing the second mask to expose the portion of the second dielectric layer over the first dielectric layer and the semiconductor substrate;

removing the portion of the second dielectric layer using the second mask; and removing the second mask.

4. The method as claimed in claim 3 including:

implanting wells for the second and third voltage devices after forming the first dielectric layer.

5. The method as claimed in claim 4 including:

implanting channels for the second and third voltage devices after forming the second dielectric layer.

6. The method as claimed in claim 5 including:

cleaning the second dielectric layer and the semiconductor substrate before forming the third dielectric layer.

7. The method as claimed in claim 6 wherein the implanting of wells includes:

forming a third mask over the first dielectric layer after forming the first dielectric layer;

processing the third mask to expose the portion of the first dielectric layer over the semiconductor substrate;

implanting a dopant to implant the wells; and removing the third mask.

8. The method as claimed in claim 7 wherein the implanting channels includes:

forming a fourth mask over the second dielectric layer after forming the second dielectric layer;

processing the fourth mask to expose the portion of the second dielectric layer over the first dielectric layer and the semiconductor substrate;

implanting a dopant to implant the channels; and removing the fourth mask.

9. A method for manufacturing a multiple voltage flash memory integrated circuit structure comprising:

providing a semiconductor substrate having a plurality of shallow trench isolations and a floating gate structure;

forming a plurality of dielectric layers on the semiconductor substrate, the plurality of shallow trench isolations and the floating gate structure;

removing a plurality of layers from the plurality of dielectric layers except over the floating gate structure to leave a first dielectric layer over the semiconductor substrate and the plurality of shallow trench isolations;

removing a portion of the first dielectric layer over the semiconductor substrate;

forming a second dielectric layer over the first dielectric layer and the semiconductor substrate;

removing a portion of the second dielectric layer over the first dielectric layer and the semiconductor substrate;

forming a third dielectric layer over the second dielectric layer and the semiconductor substrate;

forming a semiconductor layer over the third dielectric layer to form:
  floating gate devices including the plurality of dielectric layers and the second and third dielectric layers;
  first voltage devices including the first, second, and third dielectric layers;
  second voltage devices including the second and third dielectric layers; and
  third voltage devices including the third dielectric layer.

10. The method as claimed in claim 9 including:

forming a first mask over the first dielectric layer after forming the first dielectric layer;

processing the first mask to expose the portion of the first dielectric layer over the semiconductor substrate;

implanting first conductivity wells for the second and third voltage devices using the first mask;

removing the portion of the first dielectric layer using the first mask; and removing the first mask.

11. The method as claimed in claim 10 including:

forming a second mask over the first dielectric layer after forming the first dielectric layer;

processing the second mask to expose the portion of the first dielectric layer over the semiconductor substrate;

implanting second conductivity wells for the second and third voltage devices using the second mask;

removing the portion of the first dielectric layer using the second mask; and removing the second mask.

12. The method as claimed in claim 11 including:

forming a third mask over the second dielectric layer after forming the second dielectric layer;

processing the third mask to expose the portion of the second dielectric layer over the first dielectric layer;

implanting a second conductivity channel for the first conductivity well second voltage device using the third mask; and removing the third mask.

13. The method as claimed in claim 12 including:

forming a fourth mask over the second dielectric layer after forming the second dielectric layer;

processing the fourth mask to expose the portion of the second dielectric layer over the first dielectric layer;

implanting a first conductivity channel for the second conductivity well second voltage device using the fourth mask; and removing the fourth mask.

14. The method as claimed in claim 13 including:

forming a fifth mask over the second dielectric layer after forming the second dielectric layer;

processing the fifth mask to expose the portion of the second dielectric layer over the first dielectric layer;

implanting a second conductivity channel for the first conductivity well third voltage device using the fifth mask; and removing the fifth mask.

15. The method as claimed in claim 14 including:

forming a sixth mask over the second dielectric layer after forming the second dielectric layer;

processing the sixth mask to expose the portion of the second dielectric layer over the first dielectric layer;

implanting a first conductivity channel for the second conductivity third voltage device using the sixth mask; and removing the sixth mask.

16. The method as claimed in claim 15 including:

removing the second dielectric layer using the sixth mask; and cleaning the second dielectric layer after removing the sixth mask.

17. A method for manufacturing a dual voltage flash memory integrated circuit structure comprising:

providing a silicon substrate having a plurality of shallow trench isolations and a floating gate structure;

forming oxide-nitride-oxide layers on the silicon substrate, the plurality of shallow trench isolations and the floating gate structure;

removing oxide-nitride layers from the oxide-nitride-oxide layers except over the floating gate structure to leave a oxide layer over the silicon substrate and the plurality of shallow trench isolations;

removing a portion of the oxide layer over the silicon substrate;

forming a first gate oxide layer over the oxide layer and the silicon substrate;

removing a portion of the first gate oxide layer over the oxide layer and the silicon substrate;

forming a second gate oxide layer over the first gate oxide layer and the silicon substrate;

forming a polysilicon layer over the second gate oxide layer to form:

floating gate devices including the oxide-nitride-oxide layers and the first and second gate oxide layers;

first voltage devices including the oxide, first and second gate oxide layers;

second voltage devices including the first and second gate oxide layers; and third voltage devices including the second gate oxide layer.

18. The method as claimed in claim 17 including:

forming a first mask over the oxide layer after forming the oxide layer;

processing the first mask to expose the portion of the oxide layer over the silicon substrate;

implanting N-wells for the second and third voltage devices using the first mask;

removing the portion of the oxide layer using the first mask; and removing the first mask.

19. The method as claimed in claim 18 including:

forming a second mask over the oxide layer after forming the oxide layer;

processing the second mask to expose the portion of the oxide layer over the silicon substrate;

implanting P-wells for the second and third voltage devices using the second mask;

removing the portion of the oxide layer using the second mask; and removing the second mask.

20. The method as claimed in claim 19 including:

forming a third mask over the first gate oxide layer after forming the first gate oxide layer;

processing the third mask to expose the portion of the first gate oxide layer over the oxide layer;

implanting a P-channel for the N-well second voltage device using the third mask; and removing the third mask.

21. The method as claimed in claim 20 including:

forming a fourth mask over the first gate oxide layer after forming the first gate oxide layer;

processing the fourth mask to expose the portion of the first gate oxide layer over the oxide layer;

implanting a N-channel for the P-well second voltage device using the fourth mask; and removing the fourth mask.

22. The method as claimed in claim 21 including:

forming a fifth mask over the first gate oxide layer after forming the first gate oxide layer;

processing the fifth mask to expose the portion of the first gate oxide layer over the oxide layer;

implanting a P-channel for the N-well third voltage device using the fifth mask; and removing the fifth mask.

23. The method as claimed in claim 22 including:

forming a sixth mask over the first gate oxide layer after forming the first gate oxide layer;

processing the sixth mask to expose the portion of the first gate oxide layer over the oxide layer;

implanting a N-channel for the P-well third voltage device using the sixth mask; and removing the sixth mask.

24. The method as claimed in claim 23 including:

removing the first gate oxide layer using the sixth mask; and cleaning the first gate oxide layer after removing the sixth mask.

25. A method for manufacturing a dual voltage flash memory integrated circuit structure comprising:

providing a silicon substrate having a plurality of shallow trench isolations and a floating gate structure;

forming oxide-nitride-oxide layers on the silicon substrate, the plurality of shallow trench isolations and the floating gate structure;

forming an initial mask over the oxide-nitride-oxide layers to expose the oxide-nitride-oxide layers except over the floating gate structure;

removing oxide-nitride layers from the exposed oxide-nitride-oxide layers using the initial mask to leave an oxide layer over the silicon substrate and the plurality of shallow trench isolations;

removing the initial mask;

forming a first mask over the oxide layer after forming the oxide layer;

processing the first mask to expose the portion of the oxide layer over the silicon substrate;

implanting N-wells through the exposed portion of the oxide layer using the first mask;

removing the exposed portion of the oxide layer using the first mask;

removing the first mask;

forming a second mask over the oxide layer after forming the oxide layer;

processing the second mask to expose the portion of the oxide layer over the silicon substrate;

implanting P-wells through the exposed portion of the oxide layer using the second mask;

removing the portion of the oxide layer using the second mask;

removing the second mask;

forming a third mask over the first gate oxide layer after forming the first gate oxide layer;

processing the third mask to expose the portion of the first gate oxide layer over the oxide layer;

implanting a P-channel for the N-well using the third mask;

removing the third mask;

forming a fourth mask over the first gate oxide layer after forming the first gate oxide layer;

processing the fourth mask to expose the portion of the first gate oxide layer over the oxide layer;

implanting a N-channel for the P-well using the fourth mask; and removing the fourth mask;

forming a fifth mask over the first gate oxide layer after forming the first gate oxide layer;

processing the fifth mask to expose the portion of the first gate oxide layer over the oxide layer;

implanting a P-channel for the N-well third voltage device using the fifth mask;

removing the fifth mask;

forming a sixth mask over the first gate oxide layer after forming the first gate oxide layer;

processing the sixth mask to expose the portion of the first gate oxide layer over the oxide layer;

implanting a N-channel for the P-well third voltage device using the sixth mask; and removing the sixth mask;

forming a first gate oxide layer over the oxide layer and the silicon substrate;

removing a portion of the first gate oxide layer over the oxide layer and the silicon substrate using the sixth mask;

forming a second gate oxide layer over the first gate oxide layer and the silicon substrate; and forming a polysilicon layer over the second gate oxide layer to form:

floating gate devices including the oxide-nitride-oxide layers and the first and second gate oxide layers;

first voltage devices including the oxide, first and second gate oxide layers;

second voltage devices including the first and second gate oxide layers; and third voltage devices including the second gate oxide layer.

\* \* \* \* \*

UNITED STATES PATENT AND TRADEMARK OFFICE
CERTIFICATE OF CORRECTION

PATENT NO.    : 6,399,443 B1
DATED         : June 10, 2002
INVENTOR(S)   : Chwa et al.

It is certified that error appears in the above-identified patent and that said Letters Patent is hereby corrected as shown below:

Column 7,
Line 44, delete "3." and the carriage return which precedes it. (The sentence "The ONO mask 26 is removed." should be the last sentence on line 43.)

Signed and Sealed this

Eighth Day of October, 2002

Attest:

Attesting Officer

JAMES E. ROGAN
Director of the United States Patent and Trademark Office